US012704658B2

(12) United States Patent
Eilertsen

(10) Patent No.: US 12,704,658 B2
(45) Date of Patent: Aug. 11, 2026

(54) MICROWAVE TREATMENT OF REPLICATED OPTICAL STRUCTURES

(71) Applicant: NILT Switzerland GmbH, Horgen (CH)

(72) Inventor: James Eilertsen, Skodsborg (DK)

(73) Assignee: NILT Switzerland GmbH, Horgen (CH)

( * ) Notice: Subject to any disclaimer, the term of this patent is extended or adjusted under 35 U.S.C. 154(b) by 505 days.

(21) Appl. No.: 18/030,192

(22) PCT Filed: Oct. 8, 2021

(86) PCT No.: PCT/EP2021/077839

§ 371 (c)(1),
(2) Date: Apr. 4, 2023

(87) PCT Pub. No.: WO2022/078894

PCT Pub. Date: Apr. 21, 2022

(65) Prior Publication Data

US 2023/0333281 A1 Oct. 19, 2023

Related U.S. Application Data

(60) Provisional application No. 63/092,269, filed on Oct. 15, 2020.

(51) Int. Cl.
*G02B 1/00* (2006.01)
*G03F 7/00* (2006.01)

(52) U.S. Cl.
CPC ........... *G02B 1/002* (2013.01); *G03F 7/0002* (2013.01); *G03F 7/0005* (2013.01); *G02B 2207/101* (2013.01)

(58) Field of Classification Search
CPC .. G02B 1/002; G02B 2207/101; G02B 13/16; G03F 7/0002; G03F 7/0005; G03F 7/0047
See application file for complete search history.

(56) References Cited

U.S. PATENT DOCUMENTS 7,294,449 B1 * 11/2007 Gudeman ............. G03F 7/0047 430/270.1
2005/0158533 A1 * 7/2005 Chapman ............ B29C 44/3415 249/134

(Continued)

FOREIGN PATENT DOCUMENTS

CN 102775921 11/2012
CN 102775921 A * 11/2012

(Continued)

OTHER PUBLICATIONS

English translation of KR-20140026814-A by EPO. (Year: 2014).*

(Continued)

*Primary Examiner* — Inja Song
(74) *Attorney, Agent, or Firm* — Fish & Richardson P.C.

(57) ABSTRACT

An example method includes pressing a face of a stamp into a replication material disposed on a substrate, to cause the replication material to have a predetermined characteristic, in which a plurality of nano-sized microwave susceptors are embedded in the replication material, curing the replication material by applying microwaves to the replication material, and removing the face of the stamp from contact with the replication material.

21 Claims, 5 Drawing Sheets

(56) References Cited

U.S. PATENT DOCUMENTS

| | | | | |
|---|---|---|---|---|
| 2014/0072720 | A1* | 3/2014 | Watkins | H01B 1/08 252/521.1 |
| 2015/0246479 | A1 | 9/2015 | Yim et al. | |
| 2019/0243237 | A1* | 8/2019 | Watkins | C23C 18/1283 |
| 2020/0249568 | A1* | 8/2020 | Rao | C09D 163/00 |
| 2021/0325778 | A1* | 10/2021 | Ceballos | H01L 21/28123 |

FOREIGN PATENT DOCUMENTS

| | | | | |
|---|---|---|---|---|
| GB | 2463860 A | * | 3/2010 | B29C 41/06 |
| KR | 20140026814 | | 3/2014 | |
| KR | 20140026814 A | * | 3/2014 | B82B 3/0038 |

OTHER PUBLICATIONS

English translation of CN-102775921-A. (Year: 2012).*
Liu et al., "Microwave pyrolysis of polyethylene terephthalate (PET) plastic bottle sheets for energy recovery", Journal of Analytical and Applied Pyrolysis, 161, 2022, 105414. (Year: 2022).*
Berghof (A blog of Berghof, "Interaction of microwave radiation with other materials," available at https://www.berghof-instruments.com/en/overview-of-digestion-techniques/microwaveheating/interaction-of-microwave-radiation-with-other-materials/). (Year: 2025).*
Chen et al., "Direct Sputtering on PDMS for Investigation of Stretchable and Transparent Microstrip Line," in IEEE Transactions on Components, Packaging and Manufacturing Technology, vol. 9, No. 9, pp. 1741-1747, Sep. 2019. (Year: 2019).*
Laaksonen et. al., "Influence of high-refractive-index oxide coating on optical properties of metal nanoparticles," J. Opt. Soc. Am. B 30, 338-348 (2013). (Year: 2013).*
Johnson et al. "Optical Constants of the Nobel Metals," Phys. Rev. B 6, 4370-4379 (1972). (Year: 1972).*
Buchanan et. al., "Optical and Electrical Properties of Yttria Stabilized Zirconia (YSZ) Crystals," J. Electrochem. Soc. 130, 1983, pp. 962-966. (Year: 1983).*
Teixeira et.al., "Polydimethylsiloxane mechanical properties: A systematic review," AIMS Materials Science, 2021, 8 (6), 952-973. (Year: 2021).*
Clusen, "Float zone silicon for infrared and microwave applications," Proc. of SPIE, vol. 5621, pp. 66-76, published on Dec. 16, 2004. (Year: 2004).*
International Preliminary Report on Patentability in International Appln. No. PCT/EP2021/077839, dated Apr. 27, 2023, 9 pages.
International Search Report and Written Opinion in International Appln. No. PCT/EP2021/077839, dated Feb. 24, 2022, 15 pages.
Invitation to Pay Additional Fees in International Appln. No. PCT/EP2021/077839, dated Jan. 3, 2022, 10 pages.
Xie et al., "Three-dimensional periodic structured absorber for broadband electromagnetic radiation absorption," Electronic Materials Letters, 2020, 16:340-346.

* cited by examiner

[continued from FIG. 3D]
FIG. 3E
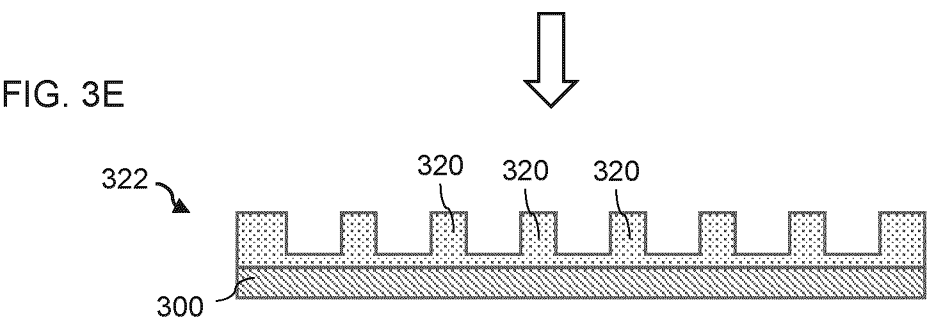

MICROWAVE TREATMENT OF REPLICATED OPTICAL STRUCTURES

CROSS-REFERENCE TO RELATED APPLICATIONS

This application is a National Stage Application under 35 U.S.C. § 371 and claims the benefit of International Application No. PCT/EP2021/077839, filed Oct. 8, 2021, which claims priority to U.S. Application No. 63/092,269, filed Oct. 15, 2020, the disclosure of which is incorporated herein by reference.

FIELD OF THE DISCLOSURE

The present disclosure relates to optical metastructures including nanoparticles.

BACKGROUND

Advanced optical elements may include a metasurface, which refers to a surface with distributed small structures (e.g., meta-atoms) arranged to interact with light in a particular manner. For example, a metasurface, which also may be referred to as a metastructure, can be a surface with a distributed array of nanostructures. The nanostructures may, individually or collectively, interact with light waves. For example, the nanostructures or other meta-atoms may change a local amplitude, a local phase, or both, of an incoming light wave.

When meta-atoms (e.g., nanostructures) of a metasurface are in a particular arrangement, the metasurface may act as an optical element such as a lens, lens array, beam splitter, diffuser, polarizer, bandpass filter, or other optical element. In some instances, metasurfaces may perform optical functions that are traditionally performed by refractive and/or diffractive optical elements. The meta-atoms may be arranged so that the metastructure functions, for example, as a lens, grating, coupler or other optical element. In other instances, the meta-atoms may be arranged so that the metastructure can function, for example, as a fanout grating, diffuser or other optical element. In some cases, the metasurfaces may perform other functions, including polarization control, negative refractive index transmission, beam deflection, vortex generation, polarization conversion, optical filtering, and plasmonic optical functions.

In a replication process, a given structure or a negative thereof is reproduced. In some cases, a structure is reproduced in a replication material disposed on a substrate.

SUMMARY

In one aspect, the present disclosure describes a method including pressing a face of a stamp into a replication material disposed on a substrate, to cause the replication material to have a predetermined characteristic, in which a plurality of nano-sized microwave susceptors are embedded in the replication material, curing the replication material by applying microwaves to the replication material, and removing the face of the stamp from contact with the replication material.

Implementations of this or other methods may have one or more of the following characteristics. A plurality of optical nanoparticles are embedded in the replication material. The plurality of nano-sized microwave susceptors is the same as the plurality of optical nanoparticles. The plurality of optical nanoparticles have a higher refractive index than the plurality of nano-sized microwave susceptors. The predetermined characteristic includes a surface structure of the replication material. At least a portion of the substrate, at least a portion of the stamp, or both, are each substantially transparent to the microwaves.

The disclosure also describes a method including pressing a face of a stamp into a replication material disposed on a substrate, to cause the replication material to have a predetermined characteristic, in which a plurality of nanoparticles are embedded in the replication material, at least a portion of the plurality of nanoparticles being nano-sized microwave susceptors, at least partially curing the replication material, and heating the at least partially cured replication material and the plurality of nanoparticles by applying microwaves to the plurality of nanoparticles.

Implementations of this or other methods may include one or more of the following characteristics. Heating the at least partially cured replication material and the plurality of nanoparticles by applying microwaves causes removal of at least some of the replication material. At least partially curing the replication material includes applying heat, UV radiation, or both heat and UV radiation. Heating the at least partially cured replication material and the plurality of nanoparticles by applying microwaves causes the plurality of nanoparticles to sinter. The sintered plurality of nanoparticles form an optical metastructure. The method includes, prior to heating the at least partially cured plurality of nanoparticles, removing the face of the stamp from contact with the replication material. At least some of the plurality of nanoparticles are optical nanoparticles. The predetermined characteristic includes a surface structure of the replication material. At least a portion of the substrate is substantially transparent to the microwaves.

The disclosure also describes optical devices. For example, the disclosure describes an optical device including a substrate and an optical metastructure on a surface of the substrate, the optical metastructure including a replication material, and a plurality of nanoparticles embedded in the replication material, at least a portion of the plurality of nanoparticles being nano-sized microwave susceptors.

The disclosure also describes an optical device including a substrate, and an optical metastructure on a surface of the substrate, the optical metastructure composed of a plurality of nanoparticles fused to one another, at least some of the plurality of nanoparticles being nano-sized microwave susceptors.

Implementations of these or other optical devices may include one or more of the following characteristics. At least some of the plurality of nanoparticles are optical nanoparticles. The nano-sized microwave susceptors are the same as the optical nanoparticles. At least a portion of the substrate is substantially transparent to microwave radiation.

The disclosure also describes modules. For example, the disclosure describes a module including at least one of a light-emitting device or a light-sensitive device; and an optical device in accordance with the descriptions of this disclosure, in which the optical device is configured (i) to interact with light generated by the light emitting device, or (ii) to interact with light incident on the module such that light passing through the optical device is received by the light-sensitive device.

Embodiments of the subject matter described in this specification can be implemented to realize one or more of at least the following advantages. Optical performance of optical devices may be improved. Homogeneity and/or reliability of optical metastructures may be improved. Mechanical characteristics of optical metastructures may be improved. Curing and/or sintering of replicated structures may be made more rapid and/or more uniform.

The details of one or more implementations are set forth in the accompanying drawings and the description below. Other aspects, features and advantages will be apparent from the description and drawings, and from the claims.

BRIEF DESCRIPTION OF THE DRAWINGS

FIGS. 3A-3E are schematics showing an example of a fabrication process including a replication material and microwave susceptors.

DETAILED DESCRIPTION

Figure 1A:
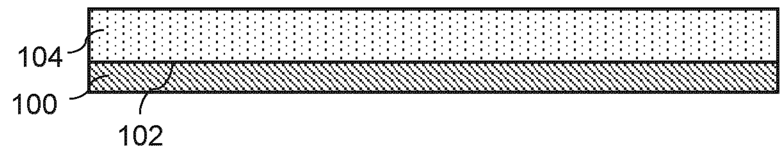
FIGS. 1A-1D are schematics showing an example of a fabrication process including a replication material and microwave susceptors.

The present disclosure describes replication processes and devices. In certain implementations, this disclosure describes imprinting a replication material in which nano-sized microwave susceptors are embedded.

Optical metastructures, as described above, may be fabricated using a variety of methods. In some cases, a metastructure can be transferred, for example, to a curable resin by replication techniques.

In general, replication refers to a technique by means of which a given structure is reproduced, e.g., embossing or molding. In an example of a replication process, a structured surface is embossed into a liquid or plastically deformable material (a "replication material"), then the material is hardened, e.g., by curing using ultraviolet (UV) radiation or heating, and then the structured surface is removed. Thus, a negative of the structured surface (a replica) is obtained.

The replicated structure provides a mechanical, electrical, or optical functionality (or a combination of those functionalities) due to the structure imposed by the structured surface.

In some cases, replication may be implemented by stamping processes. In the case of a stamping process, which also may be referred to as an imprinting process, the structured surface is a surface of a stamp that is pressed into the liquid or plastically deformable material (or has the liquid or plastically deformable material pressed into it).

"Imprinting," as used in this disclosure, may include other processes such as one or more of embossing, debossing, stamping, or nano-imprinting.

While in some implementations the liquid or plastically deformable material in an imprinting process is a bulk material (for example, a block of material), in other implementations the liquid or plastically deformable material is a layer or droplet (e.g., a coating) provided on a substrate surface.

Although replication provides the possibility of low-cost and high-throughput fabrication, in some cases, curing the replication material presents difficulties. For example, in some cases, the replication material has a low thermal conductivity, such that thermal curing results in uneven heating, long heating times, or both. Uneven heating and long heating times may cause heterogeneities in the cured replicated structures, which may lead, for example, to poor or inconsistent optical performance. Uneven heating and long heating times also may lead to mechanical stresses or fragility in replicated structures.

In some cases, for example, nanoparticles (e.g., nanoparticles having a high refractive index) are embedded in the replication material, and, during long heating times, the nanoparticles may agglomerate and/or become unevenly distributed in the replication material. Agglomerations of nanoparticles can cause the replication material/nanoparticle mixture to have locally higher refractive indexes in some places and locally lower refractive indexes in others, leading to poor or inconsistent optical performance. Nanoparticle agglomeration also may cause worsened mechanical properties, for example, reduced fracture toughness.

Similar problems also may occur for UV-cured replication materials. For example, UV radiation may not penetrate the replication material evenly, resulting in uneven curing, long curing (UV-illumination) times, or both, with the possible negative effects described above.

The use of microwave curing can help alleviate some or all of these negative effects. Microwave curing is essentially a thermal cure, except that the heat is provided by microwave stimulation rather than, or in addition to, furnace or hot-plate heating. Microwave stimulation can cause rapid and homogenous curing, which may reduce, in some implementations, thermal stress in the curing nanostructures. In addition, at least by reducing necessary curing time, microwave curing may reduce agglomeration of nanoparticles, leading to improved optical and/or mechanical performance.

In some cases, it is beneficial to embed nano-sized microwave susceptors in the replication material in order to promote rapid and uniform microwave curing, as described in this disclosure.

As shown in FIG. 1A, some implementations include a substrate 100 having a substrate surface 102 on which is disposed a replication material 104. In various implementations, the substrate 100 is composed of one or more of a semiconductor material, a polymer material, or a composite material including metals and polymers, or polymers and glass materials. In some implementations, the substrate 100 includes hardenable materials such as thermally and/or UV-curable polymers. In some implementations, the substrate 100 is transparent, e.g., a glass. In some implementations, the substrate 100 is fully or partially flexible, for example, a plastic such as poly-4,4'-oxydiphenylene pyromellitimide (e.g., Kapton™).

In some implementations, the substrate 100 includes structures not shown in FIG. 1A, e.g., metasurfaces, waveguides, or other optical structures. In some implementations, the substrate surface 102 is not flat (e.g., it is curved or stepped).

Replication material 104 is disposed on the substrate surface 102 and is imprinted using a stamp 106. In some implementations, the replication material 104 is deposited onto the substrate surface 102, after which the stamp 106 is brought into contact with the replication material 104. Examples of methods for depositing the replication material 104 include printing (e.g., inkjet printing), jetting, dispensing, screen printing, dip coating, and spin coating. In some implementations, the replication material 104 is deposited in portions of precisely known volumes (e.g., in volumes exact to within less than 3% of the deposited volume of each portion).

In some implementations, the replication material 104 is provided on the stamp 106 (e.g., onto the structured stamp surface 108), and the stamp 106 is then brought towards the substrate 100 (or has the substrate 100 brought towards it), such that the replication material 104 is disposed on the substrate 100 as a result of relative movement of the stamp 106 and the substrate 100.

The stamp 106 may be composed of a variety of materials, including a cured replication material and/or a patterned semiconductor wafer (e.g., a patterned silicon wafer), in some implementations including deposited metal layers. In some implementations, all or part of the stamp 106 is transparent, e.g., is composed of glass. In some implementations, the stamp 106 is thin and/or flexible, e.g., composed of polycarbonate foil. In some implementations, structured features of the stamp 106, such as the structured stamp surface 108, are composed of a polymer, e.g., PDMS.

In some implementations, the substrate 100, the stamp 106, or both are composed at least partially of a low-loss material. A low-loss material is transparent or substantially transparent to microwaves. For example, a low-loss material may have a loss tangent or dissipation factor (tan $\delta$) of 0.01 or less for an incident microwave frequency of 2.45 GHz for at least some temperatures between about 0° C. and about 1000° C. In some implementations, the low-loss material has a loss tangent of 0.01 or less for microwaves of 2.45 GHz at 25° C. This allows microwaves to penetrate the substrate 100 and/or the stamp 106 and heat the replication material 104, without the microwave energy being substantially absorbed by the substrate 100 and/or the stamp 106. For example, some oxides (e.g., $SiO_2$) and polymers are low-loss materials.

Microwave radiation, in some implementations, includes radiation having a frequency between about 300 MHz and 300 GHz. In some implementations, microwaves having frequencies between about 1 and about 10 GHz are used. In some implementations, microwaves having frequencies of about 2.45 GHz are used. In this disclosure, unless indicated otherwise, microwave optical properties are indicated for 2.45 GHz microwaves.

Microwave-induced heating, in various implementations, may include heating the replication material 104 over a wide-range of temperatures, for example, from 20° C. to 1000° C. or more depending on the material. A microwave chamber into which the substrate 100 is inserted may be used to apply the microwaves.

The replication material 104 includes, in various implementations, one or more of a polymer, a spin-on-glass, or any other material that may be structured in a replication process. Suitable materials for replication include, for example, hardenable (e.g., curable) polymer materials or other materials which are transformable in a hardening or solidification step (e.g., a curing step) from a liquid or plastically deformable state into a solid state. For example, in some implementations the replication material 104 is a UV-curable, microwave-curable, and/or thermally-curable epoxy or resin (e.g., a photoresist). In some implementations, the replication material 104 is transparent to visible and/or infrared light before and/or after curing.

The replication material 104, in some implementations, has characteristics suitable for a device resulting from the replication. For example, the replication material (in either as-deposited or cured form) may have a particular refractive index, thermal or electrical conductivity, or chemical or physical resistance (e.g., low reactivity with atmospheric oxygen). A wide variety of materials suitable for replication may be used.

Imprinting by the stamp 106 causes the replication material 104 to have a predetermined characteristic.

For example, in some implementations, the replication material 104 is imprinted such that the replication material 104, after imprinting, has a particular thickness or range of thicknesses. In accordance with some implementations, the replication material 104 is imprinted to have a thickness anywhere from the nanometer range to the millimeter range, or larger.

In some implementations, the replication material 104 is imprinted such that a surface of the replication material 104 has a flatness within a desired range and/or a roughness within a desired range. For example, in some implementations, a face of the stamp is smooth, such that a surface of the replication material after imprinting is smooth.

Figure 1B:
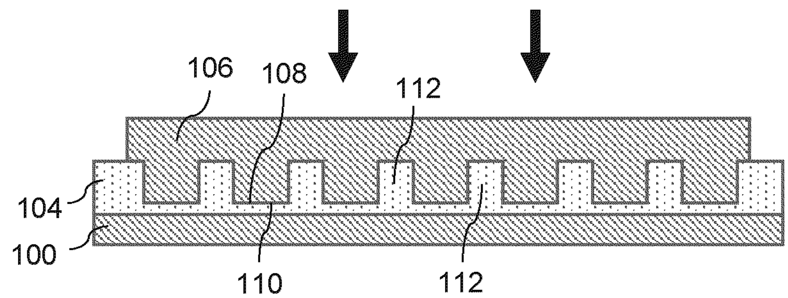

In some implementations, the predetermined characteristic of the replication material 104 is an optical functionality based at least in part on a structure of a surface of the stamp 106. For example, as shown in FIG. 1B, the structured stamp surface 108 of the stamp 106 leaves a corresponding structured surface 110 in the replication material 104. For example, after imprinting (in some implementations, including after curing), in some implementations the replication material forms diffractive optical elements including many pixels or individual structures (e.g., structures 112 in FIGS. 1B-1D). The structures 112 include, in some implementations, one or more of pillars, posts, or ridges, in some implementations arranged in arrays or other patterns. Each structure may be a meta-atom in an overall optical metastructure. In some implementations, each structure 112 has a dimension less than about 100 μm, less than about 20 μm, or less than about 1 μm.

In some implementations, the optical functionality includes one or more of lensing, focusing, reflecting or anti-reflecting, beam splitting, or optical diffusing. In some implementations, the structures 112 are microlenses, such that, after imprinting, a portion of replication material 104 forms a microlens array. In some implementations, after imprinting, the replication material 104 forms an optical metastructure or a group of optical metastructures that provide the optical functionality.

In some implementations, the predetermined characteristic is a non-optical functionality, e.g., hydrophobicity or hydrophilicity, which in some cases is determined by the form of the structures 112.

A plurality of nano-sized microwave susceptors (e.g., nanoparticle microwave susceptors) can be embedded in the replication material 104. These susceptors promote uniform and/or rapid curing and may provide improved optical performance and/or mechanical robustness to devices. The susceptors are discussed in more detail throughout this disclosure and in particular in reference to FIGS. 2A-2B.

Figure 1C:
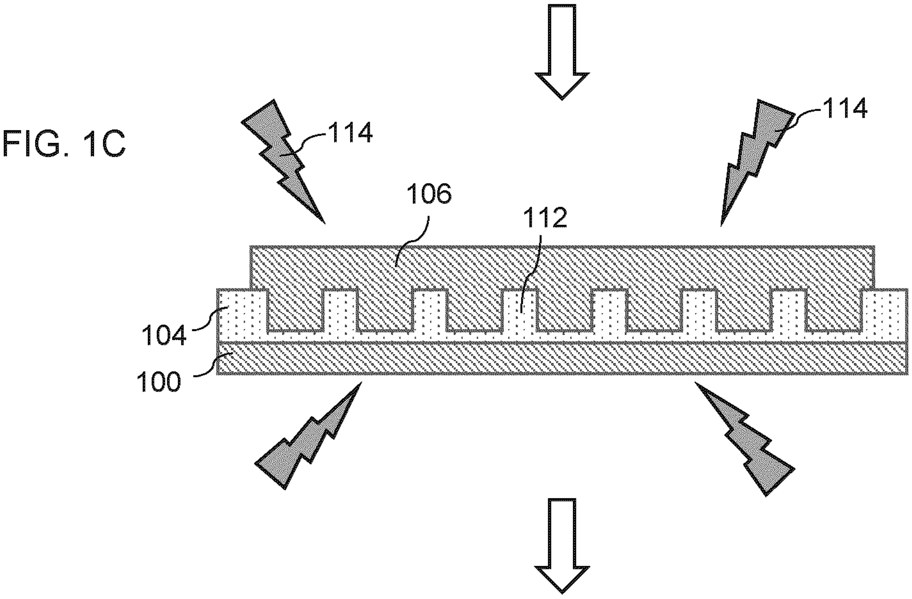

As shown in FIG. 1C, while the stamp 106 is maintained in contact with the replication material 104, microwaves 114 are applied to the replication material 104. The microwaves 114 are absorbed and/or reflected by at least some of the susceptors in the replication material and, in some implementations, absorbed by the replication material 104 itself. Microwave heating causes the replication material 104 to cure, e.g., to harden with the imprinted structures 112 intact.

In some implementations, additional stimulus (e.g., UV radiation and/or non-microwave heating) is applied to the replication material 104 before, during, and/or after the microwave radiation.

In the example of FIG. 1C, the microwaves 114 are applied while the stamp 106 remains in contact with the replication material 104. However, in some implementations the microwaves 114 are applied while the stamp 106 is not in contact with the replication material 104 (e.g., the stamp 106 is removed and then the microwaves 114 are applied).

Figure 1D:
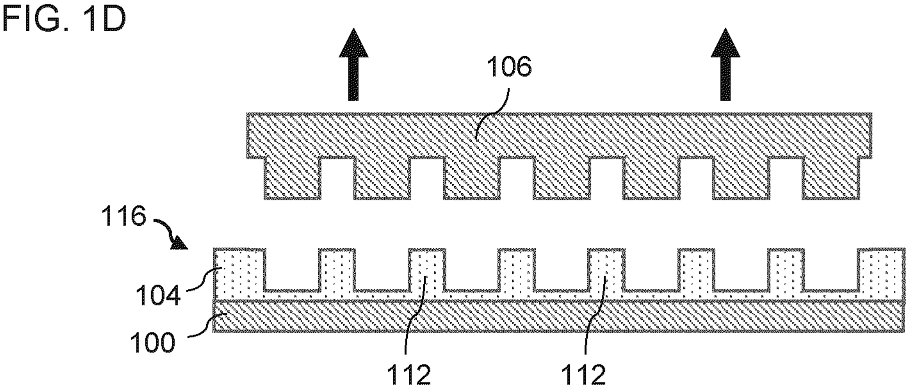

As shown in FIG. 1D, subsequent to curing, the stamp 106 is removed, leaving an optical device 116. In the optical device 116, the replication material 104 has the predetermined characteristic imposed by the stamp 106. As described throughout this disclosure, the predetermined characteristic may include an optical functionality. For example, in some implementations the imprinted replication material 104 in the optical device 116 forms one or more optical metastructures.

Figure 2A:
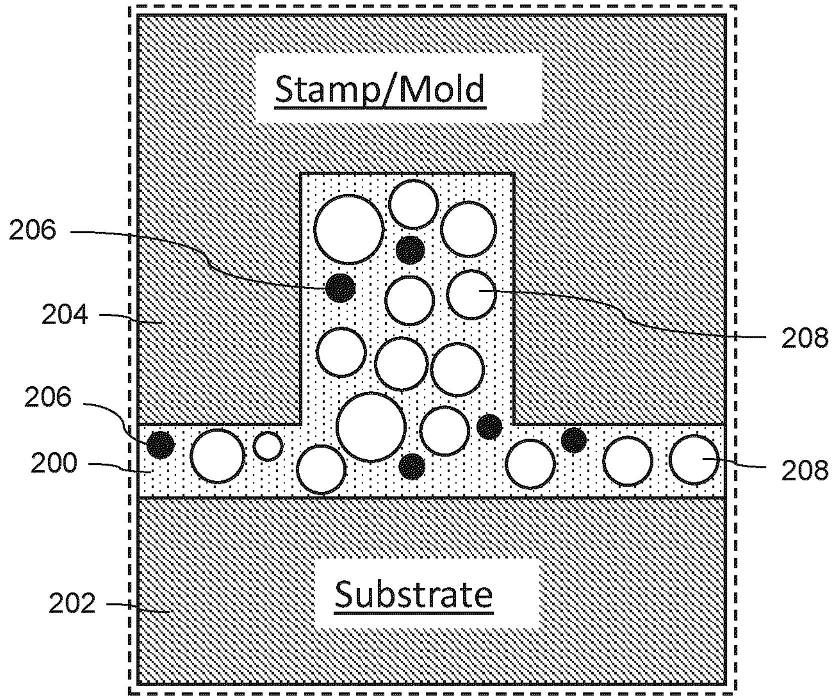
FIGS. 2A-2B are schematics showing examples of microwave susceptors embedded in a replication material.
Figure 2B:
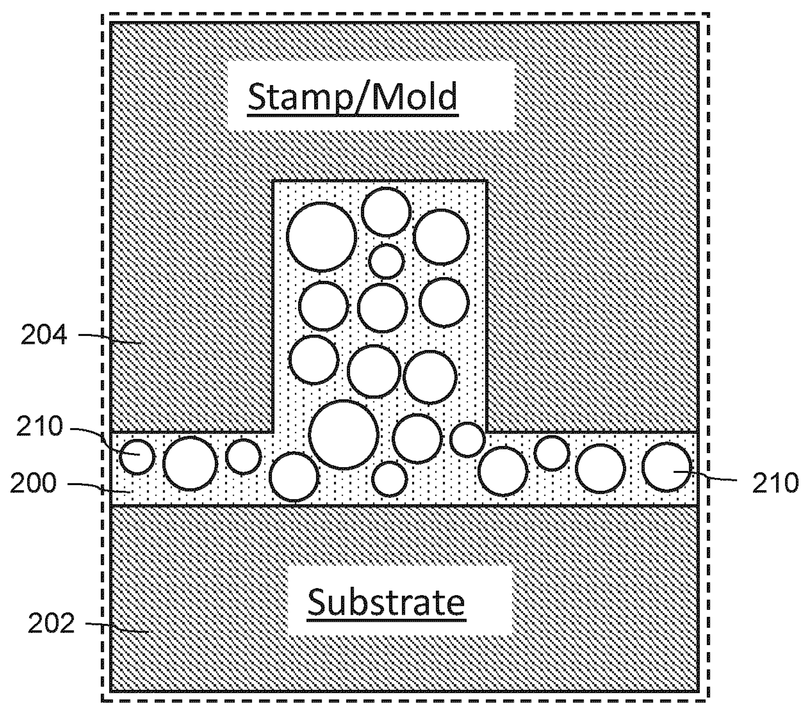

FIGS. 2A-2B show example implementations of nano-sized susceptors embedded in a replication material 200. As shown, the replication material 200 is disposed on a substrate 202 and is in contact with a stamp 204.

In the example of FIG. 2A, at least two distinct types of nanoparticles are embedded in the replication material 200. A first type of nanoparticle, a nano-sized susceptor 206, is highly absorbing or reflective to incident microwaves (e.g., the nano-sized susceptor 206 is characterized by a loss tangent, or tan δ, of about 0.01 to about 2.0), and a second type of nanoparticle, an optical nanoparticle 208, is composed of a material different from the nano-sized susceptor 206.

On the level on a meta-atom, interactions between the meta-atom and the electric-field and magnetic-field components of light incident on the meta-atom are at least partially determined by the microscopic characteristics of the elements (here, optical nanoparticles 208 and nano-sized susceptors 206) that form the meta-atom. For example, the meta-atom may affect at least one of phase, amplitude, polarization, or local impedance of incident light.

To provide a desired optical outcome of meta-atom/light and metastructure/light interactions, the optical nanoparticle 208 has one or more optical characteristics that contribute to the desired optical outcome. For example, the optical nanoparticle 208 may have a characteristic that permits the imprinted structure 112 to influence the phase, amplitude, polarization, and/or impedance of incident light more effectively than the nano-sized susceptor 206 and/or more effectively than the replication material 200 itself in the absence of embedded optical nanoparticles 208.

For example, in some implementations the optical nanoparticle 208 has a high refractive index, e.g., a higher refractive index than the nano-sized susceptor 206. In some implementations, the optical nanoparticle 208 provides improved optical performance based on at least one of polarization parameters, micromorphology (e.g., surface morphology), absorption characteristics, or another optical parameter of the optical nanoparticle 208.

"Nanoparticle" and "nano-sized," as used in this disclosure, are used broadly to refer to microscopic elements embedded in the replication material. In various implementations, nanoparticles have diameters greater than about 1 nm and less than about 1 micron (μm). In some implementations, the nanoparticles have diameters between about 10 nm and about 100 nm.

When microwaves are applied to the replication material/nanoparticle mixture, the nano-sized susceptors 206, when highly absorbing to incident microwaves, absorb a significant amount of the microwave energy and convert it to heat, which then diffuses to the surrounding replication material 200. This diffusion of heat can promote both a) more rapid heating, because more of the microwave energy is absorbed than if the nano-sized susceptors 206 were not present, and b) more uniform heating, because the nano-sized susceptors 206 are dispersed in the replication material 200 substantially uniformly and therefore act as uniformly-distributed heat sources for the replication material 200.

In some implementations, the nano-sized susceptors 206 have a larger tan δ than the surrounding replication material 200, the optical nanoparticles 208, or both. In some implementations, the nano-sized susceptors 206 have tan δ of at least about 0.01. In some implementations, the nano-sized susceptors 206 have tan δ of at least about 0.005. In some implementations, the nano-sized susceptors 206 have tan δ of about 0.005 to about 2.0 or about 0.01 to about 2.0. In some implementations, the nano-sized susceptors 206 have tan δ of at least about 2.0. These loss factors, in various implementations, may be defined for at least some temperatures between about 0° C. and about 1000° C. and/or may be defined specifically at about 25° C.

In some implementations, the nano-sized susceptors 206 are reflective to microwaves. For example, the nano-sized susceptors may be less absorbing to microwaves than the optical nanoparticles 208 and/or the replication material 200, but more reflective to microwaves than those elements. Upon application of microwaves, reflective nano-sized susceptors reflect microwave energy, e.g., to the optical nanoparticles 208 and/or to the replication material 200, which then at least partially absorbed the reflected microwave energy, increasing an overall efficiency of microwave absorption by the replication material/nanoparticle mixture.

In some implementations, separate nano-sized susceptors 206 and optical nanoparticles 208 are both embedded in the replication material 200, the nano-sized susceptors 206 have a higher microwave reflectivity than the optical nanoparticles 208, and the nano-sized susceptors 206 have lower microwave absorption (e.g., a lower loss tangent) than the optical nanoparticles 208.

The nano-sized susceptors 206 may be composed of a variety of materials. Examples of such materials are dielectrics, e.g., silicon carbide (SiC) and yttria-stabilized zirconia (YSZ). In some implementations, the nano-sized susceptors 206 are composed of a lossy material for microwaves, SiC and YSZ being two examples of such materials.

As noted above, in some implementations the optical nanoparticles 208 have a high refractive index. In this case, because of the presence of the optical nanoparticles 208 in the replication material 200, the mixture of the nano-sized susceptors 206, the optical nanoparticles 208, and the replication material 200 has a higher refractive index than if there were no optical nanoparticles 208 or nano-sized susceptors 206 in the replication material 200, or if there were only the nano-sized susceptors 206 in the replication material.

In some implementations, this higher refractive index can improve an optical functionality of a resulting optical device, e.g., the optical device 116. For example, the high refractive index may increase a strength of interactions between the optical device and light incident on, or generated by, the optical device. And, because the nano-sized susceptors 206 promote more rapid heating, the nano-sized susceptors 206 and optical nanoparticles 208 are less likely to agglomerate, resulting in a more uniform refractive index, which also may provide improved optical performance (e.g., more consistent and predictable light interactions across an optical metastructure).

As noted above, in some implementations, the optical nanoparticles 208 have a beneficial optical characteristic besides, or in addition to, a relatively high refractive index. In such implementations, the other beneficial optical characteristic may provide the improvement(s) in optical performance.

In some implementations, some or all of the optical nanoparticles 208 include a metal oxide, e.g., $TiO_2$. In some implementations, some or all of the optical nanoparticles 208 include a transition metal oxide (e.g., $VO_2$, NiO, CoO, MnO, or FeO), an intermetallic compound, a pure element (e.g., Fe), a chalcogenide (e.g., $TiS_2$), and/or an antimonide (e.g., $CoSb_3$). In some implementations, some or all of the nanoparticles include a metal.

In some implementations, the optical nanoparticles 208 have a higher refractive index than the refractive index of the replication material 200. For example, in some implementations, the optical nanoparticles 208 have refractive indexes, for visible light, of higher than about 1.7, higher than about 1.8, higher than about 1.9, or higher than about 2.0.

Different types of nanoparticles may be used in different ratios in order to optimize structural stability, device optical performance, and/or curing properties. For example, in some implementations optical nanoparticles represent about 80% of the nanoparticles and nano-sized microwave susceptors represent about 20% of the nanoparticles. In some implementations, the optical nanoparticles have a higher refractive index than do the nano-sized microwave susceptors, and the selection of a ratio of optical nanoparticles to nano-sized microwave susceptors involves a balance between improved optical performance (by a higher proportion of optical nanoparticles) and improved curing properties (by a higher proportion of nano-sized microwave susceptors). However, in some implementations, a higher proportion of nano-sized microwave susceptors does not necessarily lead to improved curing properties.

FIG. 2B shows another example embodiment of nanoparticles embedded in a replication material 200 that is disposed on a substrate 202 and imprinted by a stamp 204. In this example, one type of nanoparticle 210 (e.g., a plurality of nanoparticles composed of the same material) is both highly absorbing or reflective to incident microwaves and has one or more other beneficial optical parameters, e.g., a high refractive index, as defined in this disclosure. Consequently, the nanoparticle 210 is both a nano-sized susceptor and an optical nanoparticle. For example, both SiC nanoparticles and YSZ nanoparticles are highly absorbing to incident microwaves and have high refractive indexes, such that these nanoparticles can fulfill both the microwave heating function and the optical improvement function.

In some implementations, the embedded nanoparticles have varying sizes. For example, in some implementations a first subset of nanoparticles has a first size (or sizes in a first range), and a second subset of nanoparticles has a second, different size (or sizes in a second, different range). This may promote improved packing of the nanoparticles. In some implementations, the first and second subset correspond to different types of nanoparticles.

Although FIG. 2A shows two types of embedded nanoparticles and FIG. 2B shows one type of embedded nanoparticles, in some implementations additional types of nanoparticles are also present. In some implementations, only nano-sized microwave susceptors are present, which need not also have another beneficial optical parameter, e.g., a high refractive index.

In some implementations, the nanoparticles embedded in a replication material represent a majority of a weight of the mixture that includes the nanoparticles and the replication material. For example, in some implementations, the mixture is about 80% nanoparticles by weight and about 20% replication material by weight. In some implementations, the nanoparticles in the mixture represent between about 60% of the weight of the mixture and about 90% of the weight of the mixture. In some implementations, nanoparticles represent less than about 50% of the weight of the mixture.

Figure 3A:
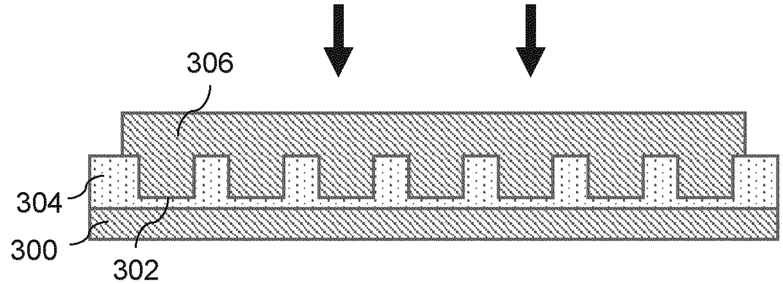

FIGS. 3A-3E show another example of a replication process performed on a replication material with embedded nano-sized microwave susceptors. As shown in FIG. 3A, a replication material 304 is disposed on a surface 302 of a substrate 300, and a stamp 306 is brought into contact with the replication material 304. Except where indicated otherwise, the processes, materials, and structures included in the example of FIGS. 3A-3E are the same as, or include a subset of, those described in reference to FIGS. 1A-1D and FIGS. 2A-2B.

A plurality of nanoparticles (not shown) are embedded in the replication material 304, at least some of which are nano-sized microwave susceptors. The plurality of nanoparticles are described in further detail in reference to FIGS. 2A-2B and throughout this disclosure. For example, in some implementations, some or all of the nanoparticles have a high refractive index. In some implementations, two or more types of nanoparticles are embedded in the replication material 304.

Figure 3B:
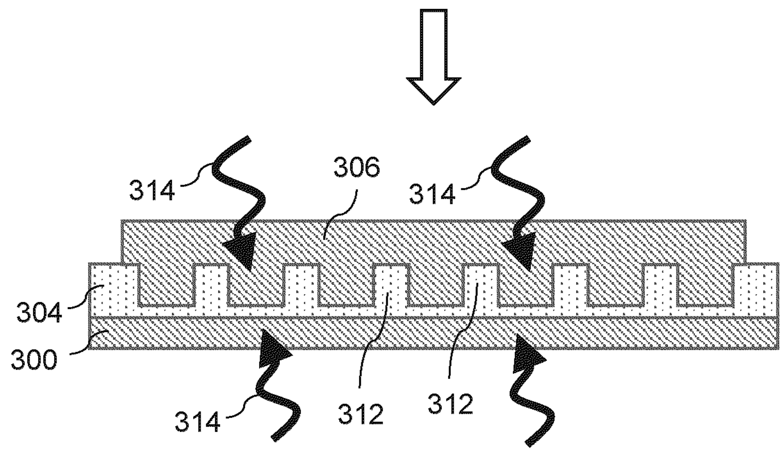

As shown in FIG. 3B, a stimulus 314 is applied to cure the replication material 304. For example, in some implementations the stimulus 314 includes UV illumination, non-microwave heating (e.g., in a furnace), or both UV illumination and non-microwave heating. In some implementations, the stimulus 314 does not include microwave radiation. The stimulus 314 may, but need not, include microwave radiation. The cure brought about by the stimulus 314 is sufficient to replicate structures of the stamp 306 in the replication material 304, such that the stamp 306 may be removed while the structures in the replication material (e.g., structures 312) are left intact. In some implementations, the cure shown in FIG. 3B is a partial cure.

Figure 3C:
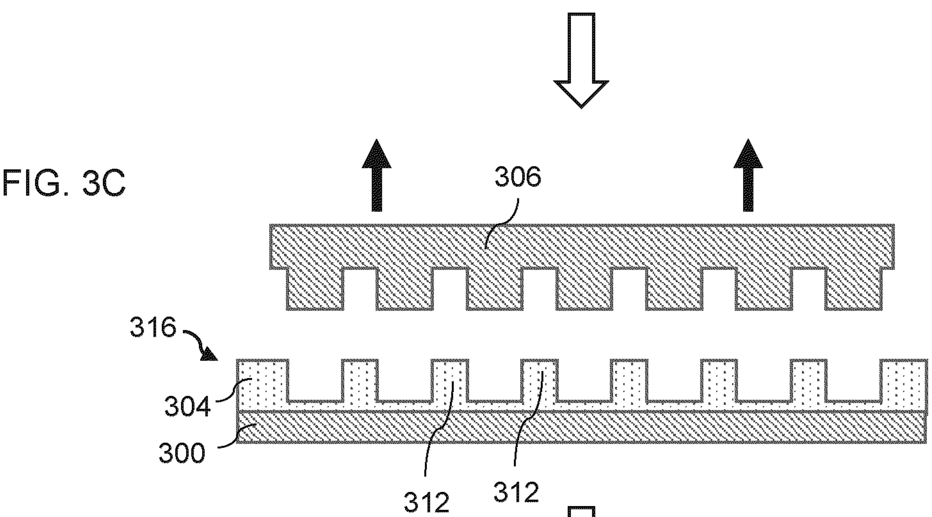

As shown in FIG. 3C, the stamp 306 is removed to leave behind a resulting optical device 316, as described above in reference to optical device 116. In some implementations, because of the optical nanoparticles embedded in the replication material 304, the optical device 316 (e.g., structures 312 of the replication material 304, which are, in some implementations, one or more optical metastructures) has improved mechanical and/or optical characteristics compared to a situation in which no nanoparticles were embedded in the replication material 304. For example, in some implementations, optical nanoparticles in the replication material 304 (either the same nanoparticles as the nano-sized microwave susceptors or a separate subset of nanoparticles) cause stronger light interaction by the optical device 316.

Figure 3D:
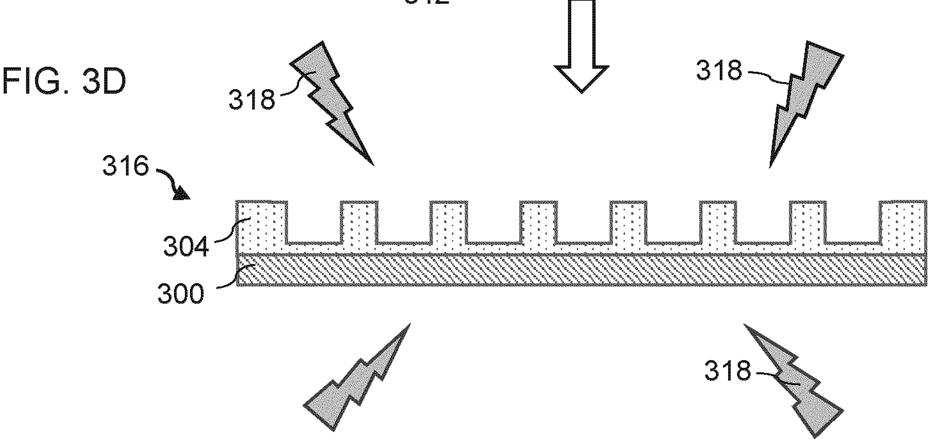

As shown in FIG. 3D, subsequent to removal of the stamp 306, microwaves 318 are applied to the optical device 316. The microwaves 318 are absorbed or reflected by the nano-sized microwave susceptors embedded in the replication material 304, and the resulting dissipated heat causes heating of the replication material 304 and the nano-sized microwave susceptors.

In some implementations, the microwave heating shown in FIG. 3D completes curing that was partially carried out by the stimulus 314. For example, in some implementations the stimulus 314 is a UV stimulus that causes a partial cure, and heating by the microwaves 318 causes the completion of the cure.

In some implementations, heating by the microwaves 318 causes one or both of a) the removal of at least some of the replication material 304 (e.g., by pyrolysis), and b) the sintering (e.g., densification and/or fusing) of the nanoparticles embedded in the replication material 304, to form sintered structures 320, as shown in FIG. 3E. An optical device 322 includes these sintered structures 320 composed of the nanoparticles, now fused to one another.

In some implementations, removal of the replication material 304 includes the replication material 304 being burned off and/or vaporized. Because of the nano-sized microwave susceptors embedded in the replication material 304, this removal process may be faster and/or more uniform than had the nano-sized microwave susceptors not been embedded in the replication material 304, or had a non-microwave heat treatment been used to remove the replication material 304. This may cause the sintered structures 320 to have finer grain sizes and/or reduce stresses in the sintered structures 320, and therefore may provide improved mechanical and/or optical properties (e.g., higher fracture toughness).

In some implementations, microwave heating is carried out while the stamp 306 remains in contact with the replication material 304 (e.g., the stamp 306 need not be removed before the process shown in FIG. 3D).

The sintered structures 320 do not include the replication material 304, or include less replication material 304 than was present before removal of the replication material 304. In some implementations, the sintered structures 320 have dimensions and shapes matching dimensions and shapes of the structures 312 formed before sintering. As a result of the removal of the replication material 304 and the sintering of the embedded nanoparticles, the sintered structures 320 are densified compared to the structures 312.

In some implementations, the sintered structures 320 have an optical functionality as described throughout this disclosure, e.g., in some implementations the sintered structures 320 form one or more optical metastructures that perform one or more optical functions (e.g., lensing). The sintered structures 320 may exhibit improved optical characteristics (e.g., a higher and/or more uniform refractive index) because of the removal of the replication material 304 and the sintering of the nanoparticles. In implementations where at least some of the nanoparticles have a high refractive index, that high refractive index may improve the optical perform of the sintered structures 320 further.

In some implementations, the process of sintering the nanoparticles and removing the replication material 304 includes multiple operations, one or more of which may include a stimulus other than microwave radiation. For example, in some implementations, lower-intensity microwave radiation is used to remove the replication material, and then higher-intensity microwave radiation is used to fuse the nanoparticles to one another. In some steps of the sintering, non-microwave heating and/or UV radiation may be used in conjunction with or instead of microwave heating. In some implementations, one sintering step (e.g., one microwave treatment, or one microwave treatment combined with another treatment) causes the removal of at least some of the replication material and also causes the nanoparticles to sinter.

Although the optical devices described in this disclosure (e.g., optical device 322) are sometimes described as resulting from particular fabrication processes (e.g., the imprinting fabrication process of FIGS. 3A-3E), in some implementations an optical device formed from sintered nanoparticles (e.g., nano-sized microwave susceptors), or an optical device including nanoparticles embedded in a replication material, is fabricated using another method. In such implementations, the nanoparticles may provide the advantages described throughout this disclosure (e.g., improved optical and/or mechanical performance) regardless of a fabrication method of the optical device.

Figure 4:
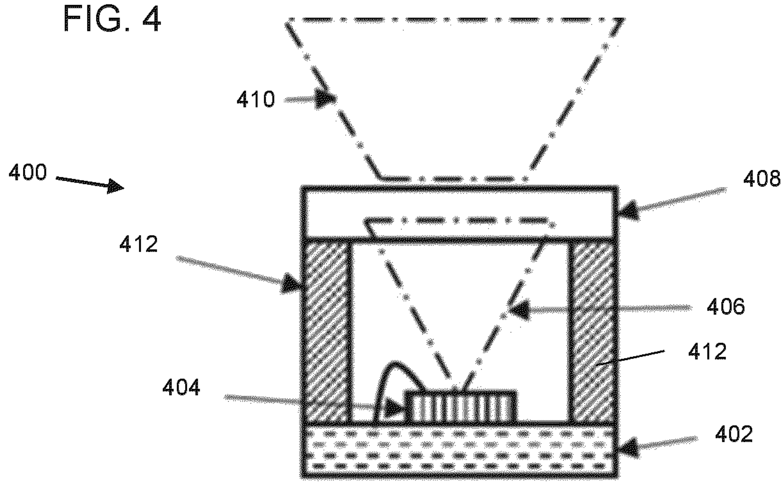
FIG. 4 is a schematic showing an example optical module.

In some implementations, devices as described throughout this disclosures may be integrated, for example, into optical or optoelectronic systems. As shown in the example of FIG. 4, a module 400 includes a substrate 402 and a light-emitting component 404 coupled to or integrated into the substrate 402. The light-emitting component 404 may include, for example, a laser (for example, a vertical-cavity surface-emitting laser) or a light-emitting diode.

Light 406 generated by the light-emitting component 404 is transmitted through a housing and then to an optical device 408, e.g., optical devices 116, 316, or 322. The optical device 408 is operable to interact with the light 406, such that modified light 410 is transmitted out of the module 400. For example, the module 400, using the optical device 408, may produce one or more of structured light, diffused light, or patterned light. The housing may include, for example, spacers 412 separating the light-emitting component 404 and/or the substrate 402 from the optical device 408.

In some implementations, the module 400 of FIG. 4 is a light-sensing module (for example, an ambient light sensor), the component 404 is a light-sensing component (for example, a photodiode, a pixel, or an image sensor), the light 406 is incident on the module 400, and the light 410 is modified by the optical device 408. For example, the optical device 408 may focus patterned light onto the light-sensing component 404.

In some implementations, the module 400 may including both light-emitting and light-sensing components. For example, the module 400 may emit light that interacts with an environment of the module 400 and is then received back by the module 400, allowing the module 400 to act, for example, as a proximity sensor or as a three-dimensional mapping device.

The modules described above may be part of, for example, time-of-flight cameras or active-stereo cameras. The modules may be integrated into systems, for example, mobile phones, laptops, television, wearable devices, or automotive vehicles.

The optical device 408 may provide advantages to the module 400 compared to modules that do not include an optical device 408 as described in this disclosure. For example, because of the inclusion of nano-sized microwave susceptors in the optical device 408, mechanical damage in the module 400 may be reduced (e.g., a yield of fabricating the module 400 may be increased). In some implementations, because the optical device 408 includes optical nanoparticles, optical characteristics of the optical device 408 and the module 400 are improved.

In this disclosure, unless indicated otherwise, references to refractive indices and loss tangents refer to values of these properties at room temperature (e.g., 25° C.).

Therefore, in accordance with the implementations of this disclosure, optical devices including nanoparticles and methods of fabricating these optical devices are described.

Although this disclosure sometimes refers to optical devices, the methods, devices, and modules described are not limited to, nor required to include, optical functionality. For example, in some implementations, nanoparticles are embedded in a replication material as described and provide a non-optical improvement or functionality.

It should be noted that any of the above-noted embodiments may be provided in combination or individually. Elements of different embodiments described herein may be combined to form other embodiments not specifically set forth above.

Accordingly, other implementations are also within the scope of the claims.

What is claimed is:

1. A method comprising:

pressing a face of a stamp into a replication material disposed on a substrate, to cause the replication material to have a predetermined characteristic, wherein a plurality of nano-sized microwave susceptors are embedded in the replication material, and wherein the plurality of nano-sized microwave susceptors comprise silicon carbide (SiC);

curing the replication material by applying microwaves to the replication material; and removing the face of the stamp from contact with the replication material.

2. The method of claim 1, wherein a plurality of optical nanoparticles are embedded in the replication material, the plurality of optical nanoparticles composed of a material different from the SiC of the plurality of nano-sized microwave susceptors.

3. The method of claim 2, wherein the plurality of nano-sized microwave susceptors have a smaller size than the plurality of optical nanoparticles.

4. The method of claim 2, wherein the plurality of optical nanoparticles have a higher refractive index than the plurality of nano-sized microwave susceptors.

5. The method of claim 2, wherein the plurality of optical nanoparticles are composed of a transition metal oxide, a chalcogenide, or an antimonide.

6. The method of claim 1, wherein the predetermined characteristic comprises a surface structure of the replication material.

7. The method of claim 1, wherein at least one of a portion of the substrate or a portion of the stamp is substantially transparent to microwaves.

8. The method of claim 1, wherein the plurality of nano-sized microwave susceptors have a diameter in a range from 10 nm to 100 nm.

9. The method of claim 1, wherein the plurality of nano-sized microwave susceptors have a microwave loss tangent in a range from 0.01 to 2.0 at 25° C.

10. The method of claim 1, wherein the plurality of nano-sized microwave susceptors have a microwave loss tangent of at least 2.0 at 25° C.

11. A method comprising:

pressing a face of a stamp into a replication material disposed on a substrate, to cause the replication material to have a predetermined characteristic, wherein a plurality of nanoparticles are embedded in the replication material, at least a portion of the plurality of nanoparticles being nano-sized microwave susceptors, wherein the nano-sized microwave susceptors comprise silicon carbide (SiC);

at least partially curing the replication material while the stamp is in contact with the replication material, wherein the at least partially curing the replication material does not include microwave radiation;

after the at least partially curing the replication material, removing the stamp from contact with the replication material; and after removing the stamp from contact with the replication material, applying microwaves to the plurality of nanoparticles.

12. The method of claim 11, wherein the applying microwaves to the plurality of nanoparticles causes removal of at least some of the replication material.

13. The method of claim 11, wherein the at least partially curing the replication material comprises applying at least one of non-microwave heating or UV radiation.

14. The method of claim 11, wherein the applying microwaves to the plurality of nanoparticles causes the plurality of nanoparticles to sinter.

15. The method of claim 14, wherein the sintered plurality of nanoparticles form an optical metastructure.

16. The method of claim 11, wherein the predetermined characteristic comprises a surface structure of the replication material.

17. The method of claim 11, wherein at least a portion of the substrate is substantially transparent to the microwaves.

18. The method of claim 11, wherein the at least partially curing the replication material is limited to a partial cure, and wherein the microwaves are configured to completely cure the replication material.

19. A method comprising:

pressing a face of a stamp into a replication material disposed on a substrate, to cause the replication material to have a predetermined characteristic, wherein a plurality of nano-sized microwave susceptors are embedded in the replication material, and wherein the plurality of nano-sized microwave susceptors comprise silicon carbide (SiC) or yttria-stabilized zirconia (YSZ), wherein a plurality of optical nanoparticles are embedded in the replication material, the plurality of optical nanoparticles composed of a material different from the SiC or the YSZ of the plurality of nano-sized microwave susceptors, and wherein the plurality of nano-sized microwave susceptors have a smaller size than the plurality of optical nanoparticles;

curing the replication material by applying microwaves to the replication material; and removing the face of the stamp from contact with the replication material.

20. The method of claim 19, wherein the plurality of optical nanoparticles have a higher refractive index than the plurality of nano-sized microwave susceptors.

21. The method of claim 19, wherein the plurality of nano-sized microwave susceptors have a microwave loss tangent in a range from 0.01 to 2.0 at 25° C.

* * * * *